(12) United States Patent
Cervelli et al.

(10) Patent No.: US 8,514,229 B2
(45) Date of Patent: *Aug. 20, 2013

(54) SIMPLIFYING A POLYGON

(71) Applicant: Palantir Technologies, Inc., Palo Alto, CA (US)

(72) Inventors: Daniel P. Cervelli, Mountain View, CA (US); John A. Carrino, Palo Alto, CA (US)

(73) Assignee: Palantir Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/712,888

(22) Filed: Dec. 12, 2012

(65) Prior Publication Data

US 2013/0100134 A1 Apr. 25, 2013

Related U.S. Application Data

(63) Continuation of application No. 13/247,986, filed on Sep. 28, 2011.

(51) Int. Cl.
*G06T 15/00* (2006.01)

(52) U.S. Cl.
USPC ........... 345/441; 345/442; 345/443; 345/472; 345/472.1

(58) Field of Classification Search
USPC ................................ 345/441–443, 472, 472.1
See application file for complete search history.

(56) References Cited

U.S. PATENT DOCUMENTS

| | | | |
|---|---|---|---|
| 5,754,182 A * | 5/1998 | Kobayashi | 345/423 |
| 6,414,683 B1 * | 7/2002 | Gueziec | 345/428 |
| 6,483,509 B1 * | 11/2002 | Rabenhorst | 345/442 |
| 2002/0003539 A1 * | 1/2002 | Abe | 345/428 |
| 2002/0130867 A1 * | 9/2002 | Yang et al. | 345/428 |
| 2003/0103049 A1 * | 6/2003 | Kindratenko et al. | 345/423 |
| 2006/0146050 A1 * | 7/2006 | Yamauchi | 345/423 |
| 2008/0223834 A1 * | 9/2008 | Griffiths et al. | 219/121.69 |
| 2009/0115786 A1 * | 5/2009 | Shimasaki et al. | 345/441 |
| 2012/0206469 A1 * | 8/2012 | Hulubei et al. | 345/581 |

OTHER PUBLICATIONS

Ghosh, 1990, "A Solution of Polygon Containment, Spatial Planning, and Other Related Problems Using Minkowski Operations", Computer Vision, Graphics, and Image Processing archive, vol. 49 Issue 1, Jan. 1990 pp. 1-35.*

(Continued)

*Primary Examiner* — Xiao M. Wu
*Assistant Examiner* — Todd Buttram
(74) *Attorney, Agent, or Firm* — Hickman Palermo Truong Becker Bingham Wong LLP

(57) ABSTRACT

Processes, machines, and computer-readable media are provided for expanding and simplifying a polygon or reducing and simplifying a polygon. Polygon expanding or reducing logic receives information that represents a polygon having a set of vertices. The polygon expanding or reducing logic determines another polygon having another set of vertices, such that the other polygon encompasses or is encompassed by the polygon, by determining, for each vertex of the set of vertices, a new set of vertices that are derived from the vertex and are at least a particular distance outside or inside the polygon. The vertex reducing logic determines whether an intermediate vertex is within the particular distance of a proposed segment between two other vertices of the other set of vertices, even though the intermediate vertex is not on the proposed segment, and, if so, removing the intermediate vertex from the other set of vertices.

30 Claims, 8 Drawing Sheets

(56) References Cited

OTHER PUBLICATIONS

Ghosh, A Solution of Polygon Containment, Spatial Planning, and Other Related Problems Using Minkowski Operations Computer Vision, Graphics, and Imaging Processing Archive, vol. 49 Issue 1, dated Jan. 1990, 35 pages.

Tangelder, J. et al., "Freeform Shape Machining Using Minkowski Operations" dated Jun. 1996 (12 pages).

"Buffer Operations in GIS" [date unknown] (7 pages).

"Image Analysis Using Mathematical Morphology" IEEE Computer Society dated 1987 (20 pages).

"JTS Topology Suite Technical Specifications" Version 1.4 dated 2003 (36 pages).

"Ramer-Douglas-Peucker algorithm" downloaded from the Internet on Aug. 3, 2011 < http://en.wikipedia.org/wiki/Ramer-Douglas-Peucker_algorithm > dated Jul. 2011 (3 pages).

European Patent Office, "Search Report" in application No. 12186236.1 dated May 17, 2013, 9 pages.

Woodbridge et al, Stephen, "Polygon Simplification" XP-002696422, dated May 8, 2011, internet citation, http://lists.osgeo.org/pipermail/geosdeve1/2011-May/--5209.html, retrieved on Apr. 24, 2013, 2 pages.

Wikipedia, "Douglas-Peucker-Algorithmus" XP-002696423, Internet citation, http://de.wikipedia.org/w/index.php?title=Douglas-Peucker-Algotithmus&oldid=91846042 retrieved on Apr. 26, 2013, 2 pages.

VB Forums, "Buffer A Polygon" XP-002696424, Internet citation, http://www.vbforums.com/showthread.php?198436-Buffer-a-Polygon, retrieved on May 2, 2013, 8 pages.

Current Claims in application No. 12186236.1, dated May 2013, 3 pages.

\* cited by examiner

FIG. 3

DERIVE, FROM A FIRST POLYGON, A SECOND POLYGON THAT ENCOMPASSES THE FIRST POLYGON BY AT LEAST A BUFFER DISTANCE
302

↓

DETECT THAT THE SECOND POLYGON INCLUDES AT LEAST ONE INTERMEDIATE VERTEX WITHIN THE BUFFER DISTANCE OF A SEGMENT BETWEEN TWO OTHER VERTICES OF THE SECOND POLYGON
304

↓

IN RESPONSE TO DETECTING THAT THE SECOND POLYGON INCLUDES THE AT LEAST ONE INTERMEDIATE VERTEX, REMOVE THE AT LEAST ONE INTERMEDIATE VERTEX FROM THE SECOND POLYGON
306

↓

DETERMINE WHETHER THE SECOND POLYGON HAS FEWER THAN A SPECIFIED NUMBER OF VERTICES
308

NO → RE-PERFORM STEPS 302-308, REPLACING THE FIRST POLYGON WITH THE SECOND POLYGON THAT PREVIOUSLY RESULTED FROM STEP 306
310

YES → USE THE FINAL SECOND POLYGON TO APPROXIMATE THE FIRST POLYGON
312

FIG. 4

DERIVE, FROM A FIRST POLYGON, A SECOND POLYGON THAT IS ENCOMPASSED WITHIN THE FIRST POLYGON BY AT LEAST A BUFFER DISTANCE 402

↓

DETECT THAT THE SECOND POLYGON INCLUDES AT LEAST ONE INTERMEDIATE VERTEX WITHIN THE BUFFER DISTANCE OF A SEGMENT BETWEEN TWO OTHER VERTICES OF THE SECOND POLYGON 404

↓

IN RESPONSE TO DETECTING THAT THE SECOND POLYGON INCLUDES THE AT LEAST ONE INTERMEDIATE VERTEX, REMOVE THE AT LEAST ONE INTERMEDIATE VERTEX FROM THE SECOND POLYGON 406

↓

DETERMINE WHETHER THE SECOND POLYGON HAS FEWER THAN A SPECIFIED NUMBER OF VERTICES 408

NO → RE-PERFORM STEPS 402-408, REPLACING THE FIRST POLYGON WITH THE SECOND POLYGON THAT PREVIOUSLY RESULTED FROM STEP 406 410

YES → USE THE FINAL SECOND POLYGON TO APPROXIMATE THE FIRST POLYGON 412

BORDER OF
COMPLEX
POLYGON
700

RADIALLY
SYMMETRIC
POLYGON
701

PARTIAL BORDER
OF EXPANDED
POLYGON
702

BORDER OF
COMPLEX
POLYGON
700

SIMPLIFYING A POLYGON

CROSS-REFERENCE TO RELATED APPLICATIONS; BENEFIT CLAIM

This application claims the benefit as a Continuation of application Ser. No. 13/247,986, filed Sep. 28, 2011, the entire contents of which is hereby incorporated by reference as if fully set forth herein, under 35 U.S.C. §120. The applicant(s) hereby rescind any disclaimer of claim scope in the parent application(s) or the prosecution history thereof and advise the USPTO that the claims in this application may be broader than any claim in the parent application(s).

TECHNICAL FIELD

The present disclosure relates to simplifying a polygon, for example, in generating displays of polygons or maps in a graphical user interface of a computer display.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright ©2011 Palantir Technologies, Inc.

BACKGROUND

Data collection techniques are becoming more fine-grained, resulting in higher definition, more complex datasets. Some data, such as geospatial data and other spatial data, may be represented using geometric figures such as polygons in two-dimensional space or polyhedrons in three-dimensional space. The geometric figures may be constructed, displayed, or otherwise utilized based on stored data that defines the figures.

A polygon may be defined by a collection of segments that connect to form a shape. Alternatively, a polygon may be defined by a collection of vertices that, when connected by segments, form a geometric shape. Similarly, a polygon may be defined by a combination of segments and vertices that, when supplemented with other segments and vertices, form a geometric shape.

As used herein, the term "vertex" refers to a point at which two segments meet, or a point on a polygon that is used to define the polygon. Any given polygon could be described with any number of vertices. Two segments may meet at a vertex with an angle of 180 degrees to form a larger segment that includes the two segments. Alternately, two segments are not collinear when the two segments meet at a vertex with an angle greater or less than 180 degrees. As used herein, the term "segment" refers to a connection or coupling between two vertices, or points on a polygon. A segment may be an arc segment, a line segment, a zig-zag segment, or some other representation of the connection.

Some polygons, such as convex polygons, may be defined by unordered segments or vertices. In a convex polygon, every internal angle is less than 180 degrees, such that an order may be implied even if the collection of vertices or segments is unordered. Other polygons, such as concave polygons, may be defined by a collection of ordered vertices, segments, or a combination thereof. A concave polygon has at least one internal angle that is greater than 180 degrees, and the order of the vertices or segments may indicate which angle(s) are greater than 180 degrees.

Once defined, polygons may be used to perform specialized operations on a dataset. For example, searches may be performed for particular data items that are inside of the polygon, for particular data items that are near the edge of the polygon, or for particular data items that are outside of the polygon. The specialized operations may be performed to determine, for each item in the dataset, whether or not the item is inside of the polygon, near the edge of the polygon, or outside of the polygon. As geometric shapes become more complex, with hundreds, thousands, or even millions or more vertices, performing these specialized operations may consume large amounts of resources, in terms of processor cycles, memory, and, more generally, time. Even worse, performing these specialized operations may not always be possible, regardless of how much time is consumed, in certain circumstances with given hardware and software resources. In one example, due to intense demands on the resources, hardware or software may fail before completing a specialized operation on a polygon with over 10,000 vertices.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

In the drawings:

FIG. 3 illustrates an example buffer simplification process for expanding a polygon and removing vertices.

FIG. 4 illustrates an example buffer simplification process for reducing a polygon and removing vertices.

DETAILED DESCRIPTION

In the following description, for the purposes of explanation, numerous specific details are set forth in order to provide a thorough understanding of the present invention. It will be apparent, however, that the present invention may be practiced without these specific details. In other instances, wellknown structures and devices are shown in block diagram form in order to avoid unnecessarily obscuring the present invention.

General Overview

Computer-implemented techniques are disclosed for expanding and simplifying a polygon. In one embodiment, one or more computing devices, such as programmed computing devices or other special-purpose computing devices, include polygon expanding logic and vertex reducing logic. The polygon expanding logic receives information that represents a first polygon having a first set of vertices. The polygon expanding logic determines a second polygon having a second set of vertices, such that the second polygon encompasses the first polygon, by determining, for each vertex of the first set of vertices, a new set of vertices that are derived from the vertex and are at least a particular distance outside the first polygon. The vertex reducing logic determines, for an intermediate vertex of the second set of vertices, whether the intermediate vertex is within the particular distance of a proposed segment between two other vertices of the second set of vertices, even though the intermediate vertex is not on the proposed segment. The vertex reducing logic removes the intermediate vertex from the second set of vertices in response to determining that the intermediate vertex is within the particular distance of the proposed segment.

For purposes of illustrating clear examples, certain embodiments are described herein with reference to polygons, but the disclosure is not limited to polygons and in other embodiments, the techniques herein may be used to simplify, display or map polytopes.

Figure 1:
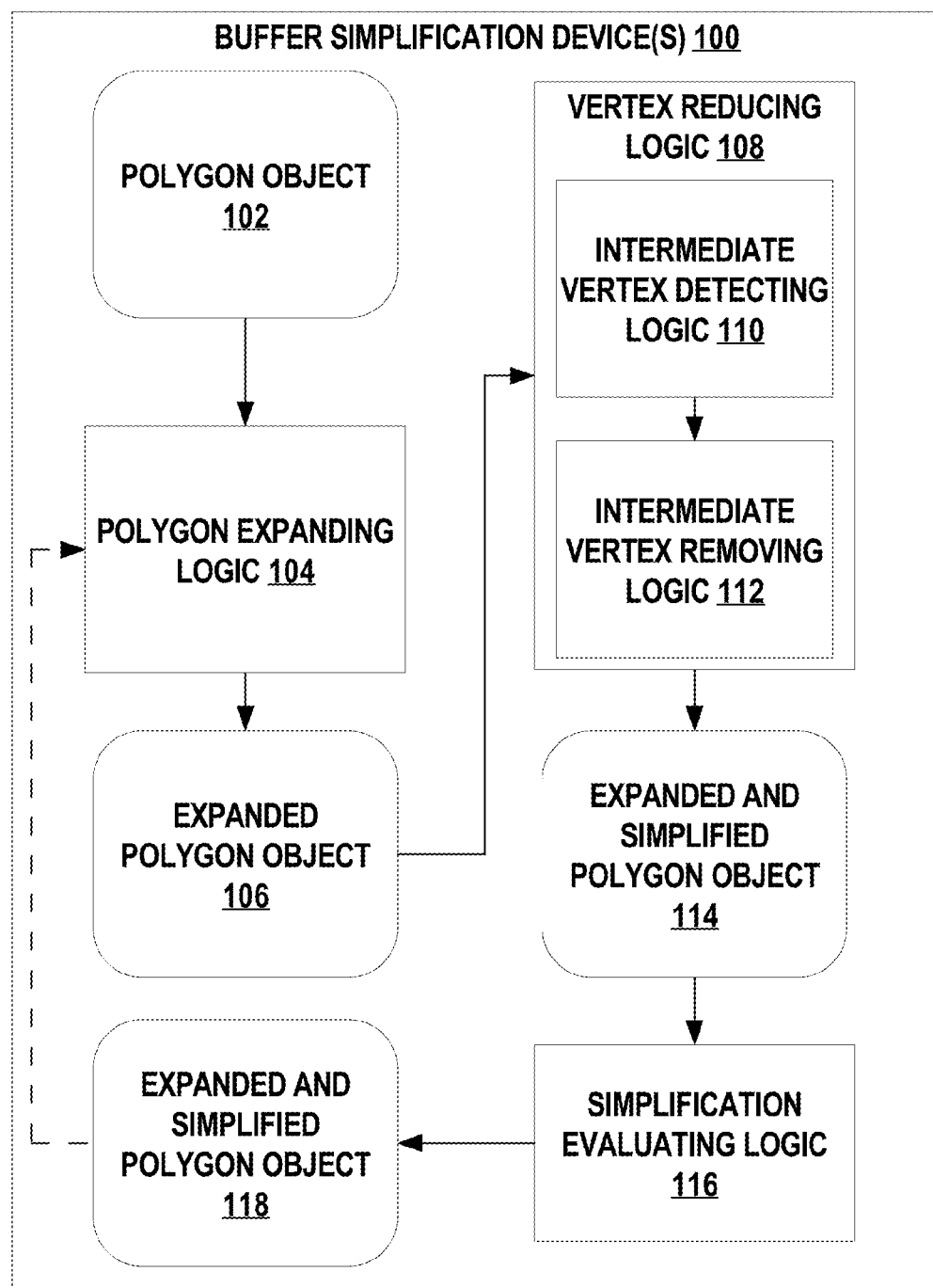
FIG. 1 illustrates an example buffer simplification device for expanding a polygon and removing vertices.

FIG. 1 illustrates an example buffer simplification device. In an embodiment, a buffer simplification device comprises polygon expanding logic 104, vertex reducing logic 108, intermediate vertex detecting logic 110, intermediate vertex removing logic 112, and simplification evaluation logic 116. The device 100 may further comprise a processor, memory, other storage, and input/output logic. Each logic element of FIG. 1 may be implemented in one or more computer programs, other software elements, or other digital electronic logic in a special-purpose computing device or general-purpose computing device as described further herein with reference to FIG. 5.

In an embodiment, polygon expanding logic 104 on buffer simplification device 100 receives a polygon object 102. Polygon expanding logic 104 generates an expanded polygon object 106 based on polygon object 102. Vertex reducing logic 108 receives expanded polygon object 106 and generates expanded and simplified polygon object 114. In particular, vertex reducing logic 108 detects intermediate vertices within expanded polygon object 106 using intermediate vertex detecting logic 110. Intermediate vertices that are within a threshold distance of a proposed line between two other vertices are then removed from polygon object 106 using intermediate vertex removing logic 112.

Expanded and simplified polygon object 114 is evaluated, by simplification evaluating logic 116, to determine whether simplified polygon object 114 is sufficiently simplified. If not, expanded and simplified polygon object 118 is inputted back into polygon expanding logic 104 for another iteration of polygon expansion and vertex reduction. Once expanded and simplified polygon object 114 is sufficiently simplified, simplification evaluation logic 116 returns expanded and simplified polygon object 114 to a client process.

FIG. 3 illustrates an example process for expanding a polygon and reducing the number of vertices on the polygon.

In step 302, a second polygon is derived from a first polygon. The second polygon encompasses the first polygon by at least a buffer distance. In step 304, the process includes detecting that the second polygon includes at least one intermediate vertex within the buffer distance of a segment between two other vertices of the second polygon. In response to detecting that the second polygon includes the at least one intermediate vertex, the at least one intermediate vertex is removed from the second polygon in step 306. The process further includes, in step 308, determining whether the second polygon has fewer than a specified number of vertices.

If the second polygon does not have fewer than the specified number of vertices, then, as stated in step 310, steps 302-308 are re-performed, replacing the first polygon with the second polygon that previously resulted from step 306. In other words, each iteration of steps 302-308 produces a new resulting polygon and determines whether the new resulting polygon is sufficiently simplified. If the resulting polygon is sufficiently simplified, then, in step 312, the resulting polygon, or final second polygon, is used to approximate the original, first polygon.

Computer-implemented techniques are also disclosed for reducing and simplifying a polygon. In one embodiment, one or more computing devices include polygon reducing logic and vertex reducing logic. The polygon reducing logic receives information that represents a first polygon having a first set of vertices. The polygon reducing logic determines a second polygon having a second set of vertices, such that the second polygon is encompassed by the first polygon, by determining, for each vertex of the first set of vertices, a new set of vertices that are derived from the vertex and are at least a particular distance inside the first polygon. Vertex reducing logic determines, for an intermediate vertex of the second set of vertices, whether the intermediate vertex is within the particular distance of a proposed segment between two other vertices of the second set of vertices, even though the intermediate vertex is not on the proposed segment. The vertex reducing logic removes the intermediate vertex from the second set of vertices in response to determining that the intermediate vertex is within the particular distance of the proposed segment.

Figure 2:
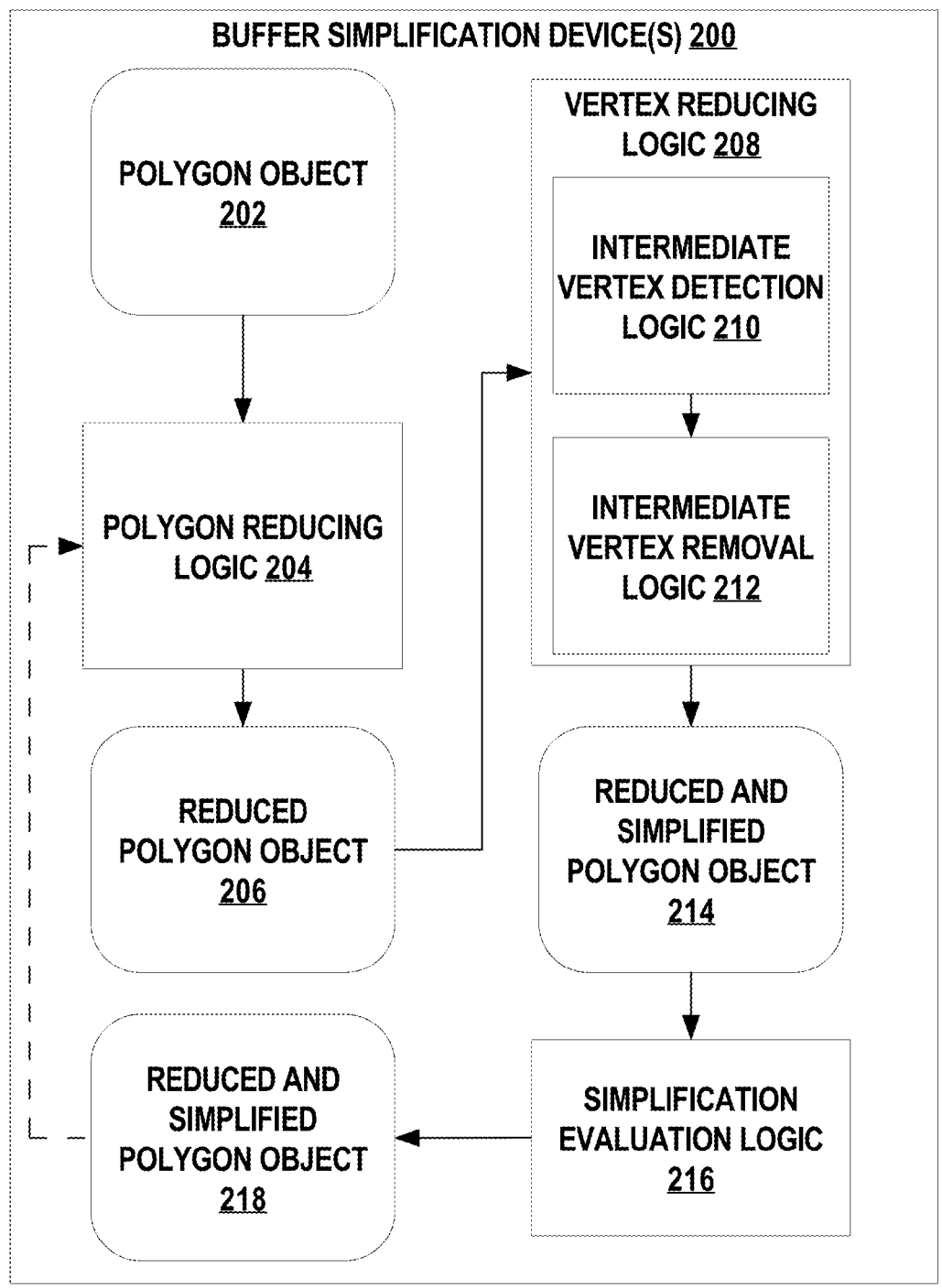
FIG. 2 illustrates an example buffer simplification device for reducing a polygon and removing vertices.

FIG. 2 illustrates an example buffer simplification device. In an embodiment, buffer simplification device 200 comprises polygon reducing logic 204, vertex reducing logic 208, intermediate vertex detection logic 210, intermediate vertex removal logic 212, and simplification evaluation logic 216. The device 200 may further comprise a processor, memory, other storage, and input/output logic. Each logic element of FIG. 2 may be implemented in one or more computer programs, other software elements, or other digital electronic logic in a special-purpose computing device or general-purpose computing device as described further herein with reference to FIG. 5.

In an embodiment, reducing logic 204 on buffer simplification device 200 receives a polygon object 202. Polygon reducing logic 204 generates a reduced polygon object 206 based on polygon object 202. Vertex reducing logic 208 receives reduced polygon object 206 and generates reduced and simplified polygon object 214. In particular, vertex reducing logic 208 detects intermediate vertices within reduced polygon object 206 using intermediate vertex detecting logic 210. Intermediate vertices that are within a threshold distance of a proposed line between two other vertices are then removed from polygon object 206 using intermediate vertex removing logic 212.

Reduced and simplified polygon object 214 is evaluated, by simplification evaluating logic 216, to determine whether simplified polygon object 214 is sufficiently simplified. If not, reduced and simplified polygon object 218 is inputted back into polygon expanding logic 204 for another iteration of polygon reduction and vertex reduction. Once reduced and simplified polygon object 214 is sufficiently simplified, simplification evaluation logic 216 returns reduced and simplified polygon object 214 to a client process.

FIG. 4 illustrates an example process for reducing the size of a polygon and reducing the number of vertices on the polygon.

In step 402, a second polygon is derived from a first polygon. The second polygon is encompassed within the first polygon by at least a buffer distance. In step 404, the process includes detecting that the second polygon includes at least one intermediate vertex within the buffer distance of a segment between two other vertices of the second polygon. In response to detecting that the second polygon includes the at least one intermediate vertex, the at least one intermediate vertex is removed from the second polygon in step 406. The process further includes, in step 408, determining whether the second polygon has fewer than a specified number of vertices.

If the second polygon does not have fewer than the specified number of vertices, then, as stated in step 410, steps 402-408 are re-performed, replacing the first polygon with the second polygon that previously resulted from step 406. In other words, each iteration of steps 402-408 produces a new resulting polygon and determines whether the new resulting polygon is sufficiently simplified. If the resulting polygon is sufficiently simplified, then, in step 412, the resulting polygon, or final second polygon, is used to approximate the original, first polygon.

In one embodiment, the polygon expanding logic generates, for each particular vertex of an original set of vertices, one or more new vertices that are a fixed distance, greater than the particular distance used by the vertex reducing logic, away from the particular vertex. In the same or a different embodiment, the one or more new vertices include all those vertices, from a fixed number of possible vertices at fixed angles away from the particular vertex, that are at least the particular distance outside of a polygon defined by the original set of vertices. In another embodiment, the one or more new vertices include all those vertices, from a fixed number of possible vertices at fixed angles away from the particular vertex, that are at least a particular distance inside a polygon defined by the original set of vertices.

In one embodiment, the vertex reducing logic further causes determining, for a plurality of intermediate vertices of the second set of vertices, whether the intermediate vertices are within the particular distance of segments between other vertices of the second set of vertices. The vertex reducing logic may remove a subset of the plurality of intermediate vertices in response to determining that intermediate vertices from the subset of the plurality of intermediate vertices are within the particular distance of segments between other vertices of the second set of vertices.

In one embodiment, the polygon expanding logic and vertex reducing logic recursively perform expanding a polygon and reducing a number of vertices of the expanded polygon. Each step of the recursion may include determining a third polygon having a third set of vertices, wherein the third set of vertices encompass a prior second polygon having a prior second set of vertices. Each step may also include, for one or more intermediate vertices of the third set of vertices, determining whether the intermediate vertex is within the particular distance of a second proposed segment between two other vertices of the third set of vertices. The vertex reducing logic may remove the intermediate vertex from the third set of vertices in response to determining that the intermediate vertex is within the particular distance of the second proposed segment between the two other vertices of the third set of vertices.

Optionally, the recursive steps of determining the third polygon, determining whether the intermediate vertex is within the particular distance, and removing the intermediate vertex may be repeated until a resulting polygon has fewer than a specified number of vertices. In one example, the specified number of vertices is received as user input. The original polygon may be displayed before or after receiving the specified number as user input, and the resulting polygon may be determined and displayed in response to receiving the specified number as user input.

In one embodiment, the polygon reducing logic and vertex reducing logic recursively perform reducing a polygon and reducing a number of vertices of the reduced polygon. Each step of the recursion may include determining a third polygon having a third set of vertices, wherein the third set of vertices is encompassed by a prior second polygon having a prior second set of vertices. Each step may also include, for one or more intermediate vertices of the third set of vertices, determining whether the intermediate vertex is within the particular distance of a second proposed segment between two other vertices of the third set of vertices. The vertex reducing logic may remove the intermediate vertex from the third set of vertices in response to determining that the intermediate vertex is within the particular distance of the second proposed segment between the two other vertices of the third set of vertices.

Optionally, the recursive steps of determining the third polygon, determining whether the intermediate vertex is within the particular distance, and removing the intermediate vertex may be repeated until a resulting polygon has fewer than a specified number of vertices. In one example, the specified number of vertices is received as user input. The original polygon may be displayed before or after receiving the specified number as user input, and the resulting polygon may be determined and displayed in response to receiving the specified number as user input.

In one embodiment, a command is received for evaluation against an original polygon. Optionally, a resulting polygon may be determined, in response to receiving the command, by repeating the steps of determining the expanded or reduced polygon, determining whether the intermediate vertex is within the particular distance, and removing the intermediate vertex. In another embodiment, the resulting polygon may be determined before the command is received. The resulting polygon may be stored in anticipation of receiving commands to be evaluated against the original polygon, or as a result of receiving the command or other commands that were evaluated against the original polygon. In response to receiving the command, the command may be evaluated against the resulting polygon rather than the original polygon.

In one example, the received command is a search or query for data items within the original polygon. Evaluating the command against the resulting polygon generates a resulting set of data items. If the resulting polygon is an expanded polygon, the resulting set of data items may include more data items than were in the original polygon. In one embodiment, evaluating the command includes determining that one or more data items in the resulting set of data items are outside of the original polygon and, in response, removing the one or more data items from the resulting set of data items.

In one example, as a correction, the one or more data items are removed from the resulting set after all or part of the resulting set determined from the expanded polygon has been returned. In another example, the one or more data items are removed before returning the resulting set.

In another example, the resulting polygon is a reduced polygon, and the resulting set of data items may include fewer data items than were in the original polygon. In one embodiment, the process further includes determining that one or more data items are in the original polygon but not in the resulting polygon and, in response, adding the one or more data items to the resulting set of data items. In one example, the one or more data items may be added or appended to the resulting set after all or part of the resulting set determined from the reduced polygon has been returned. In another example, the one or more data items are removed before returning the resulting set.

In one embodiment, the polygon expanding logic includes logic for performing a Minkowski addition expanding process on the particular vertex and a radially symmetric polygon. In another embodiment, the polygon reducing logic includes logic for performing a Minkowski subtraction reducing process on the particular vertex and a radially symmetric polygon. In one embodiment, the vertex reducing logic includes logic for performing a Ramer-Douglas-Peucker vertex reducing process on the intermediate vertex and the two other vertices.

In one embodiment, the original polygon is on a three-dimensional surface, and the particular distance used by the vertex reducing logic is a distance along the three-dimensional surface. In another embodiment, the original polygon is on a plane, and the segment is a line segment. In one example, the original polygon is a projection, from a three-dimensional surface onto the plane, of another polygon on the three-dimensional surface. In yet another embodiment, the original polygon is a face of an original polyhedron, and the simplified polygon is a corresponding face of a simplified polyhedron.

In one embodiment, the polygon expansion or reduction logic and the vertex reduction logic operate on fewer than all of the vertices in the original polygon. In one example, the original polygon has a third set of vertices in addition to the first set of vertices that are used by the polygon expansion or reduction logic and the vertex reduction logic. In this example, the step of determining the second polygon may be performed without determining, for any vertex in the third set of vertices, a new set of vertices that are at least a particular distance outside the first polygon.

The vertex reduction processes described herein may result in generation of a new polygon with fewer direction-changing vertices (i.e. vertices that join segments that meet at an angle greater than or less than 180 degrees) than an original polygon. Processing the new polygon may use significantly fewer computer resources in terms of processor time and memory. If the new polygon was expanded in size along with the vertex reduction, the new polygon may be generated to encompass the original polygon. If the new polygon was reduced in size along with the vertex reduction, the new polygon may be generated to be encompassed by the original polygon.

The computer-implemented processes described herein may be implemented as one or more processes implemented by one or more special-purpose computing devices, as one or more non-transitory computer-readable storage media storing instructions for causing one or more processes, or as one or more special-purpose computing devices configured to perform and/or performing the one or more processes. The computer-implemented techniques may also be implemented as any other statutory process, machine, or article of manufacture.

Polygon Expansion

In one embodiment, the polygon expanding logic receives information that represents an original polygon having a set of original vertices. The polygon expanding logic determines an expanded polygon having a set of expanded vertices, such that the expanded polygon encompasses the original polygon, by determining, for each original vertex of the set of original vertices, a set of expanded vertices that are derived from the original vertex and are at least a particular distance outside the original polygon. The set of expanded vertices may be determined by creating new vertices around each of the original vertices in the original polygon. New vertices that are inside the original polygon and optionally new vertices that are within a particular distance of the border of the original polygon may be excluded or removed from the set of expanded vertices, leaving only those new vertices that are outside the original polygon, optionally at least the particular distance outside the original polygon.

In one embodiment, a new set of vertices is created around a given vertex of the original polygon by creating new vertices at a specified distance away from the given vertex. The specified distance may be, for example, greater than the particular distance that is used for determining which new vertices are excluded or removed from the set of expanded vertices. For example, new vertices may be created at a distance, r, from the given vertex. In a particular example, a new vertex may be included in the set of expanded vertices only if the new vertex is greater than or equal to a distance, d, from the original polygon. Alternately, a new vertex may initially be included in the set but may be removed if the new vertex is not greater than or equal to a distance, d, from the original polygon.

In a particular example, suppose that a given vertex, $v_0$, lies in the middle of a flat portion of the surface of the original polygon, connecting two line segment portions of the original polygon at an angle of 180 degrees. If three new vertices, $v_1$, $v_2$, and $v_3$, are created at angles $\Theta_1=45$ degrees, $\Theta_2=90$ degrees, and $\Theta_3=135$ degrees with respect to the surface of the original polygon, at a distance, r, from the given vertex, then the distances of the new vertices from the surface of the original polygon will be r*sin ($\Theta$), or $d_1 \approx r*0.71$, $d_2 \approx r$, and $d_3 \approx r*0.71$. New vertices may be excluded from the set of expanded vertices if they are not at least a threshold distance outside of the surface of the original polygon. For example, the threshold distance may be greater than or equal to r*0.71 (i.e., r*(sq. rt. 2)/2)), in which case vertices $v_1$ and $v_3$ would be excluded from the set of expanded vertices, leaving only $v_2$, at a distance r from $v_0$, and at an angle of 90 degrees from the surface of the original polygon. In another example, if the threshold distance is less than r*0.71, then vertices $v_1$, $v_2$, and $v_3$ would all be kept as part of the set of expanded vertices for an expanded polygon.

In one embodiment, the new set of vertices is created using new vertices at the same specified angles for all original vertices in the original polygon. In a particular embodiment, the new set of vertices is created using Minkowski addition on the original polygon and an expansion polygon. The expansion polygon includes a set of expansion vertices and an origin. Using Minkowski addition, the original polygon may be expanded by copying the expansion polygon to the original vertices of the original polygon such that the origin or center of each copy of the expansion polygon is located at the original vertex. A set of expanded points may be determined by selecting those points of the various copies of the expansion polygons that are outside of the original polygon, or, optionally, at least a threshold distance outside of the original polygon. The set of expansion points may also be determined as the outermost points from the copied expansion polygons.

Figure 7A:
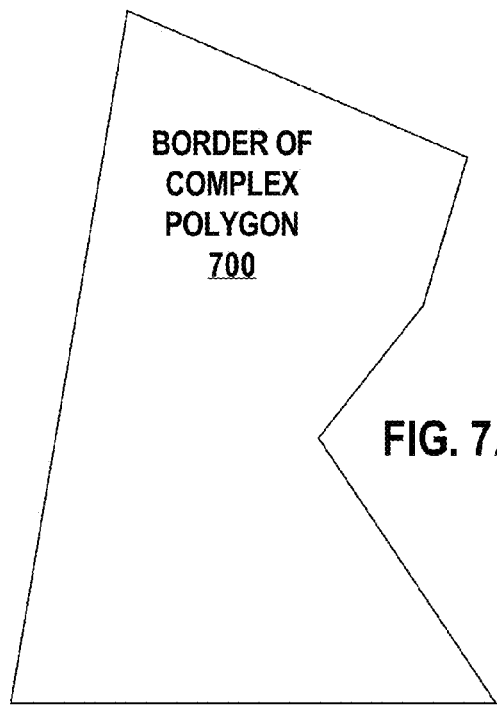
FIG. 7A illustrates an example complex polygon.
Figure 7B:
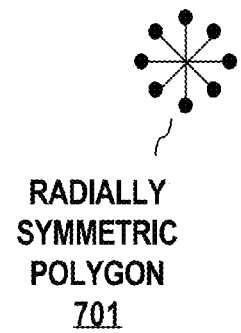
FIG. 7B illustrates an example radially symmetric polygon.
Figure 7C:
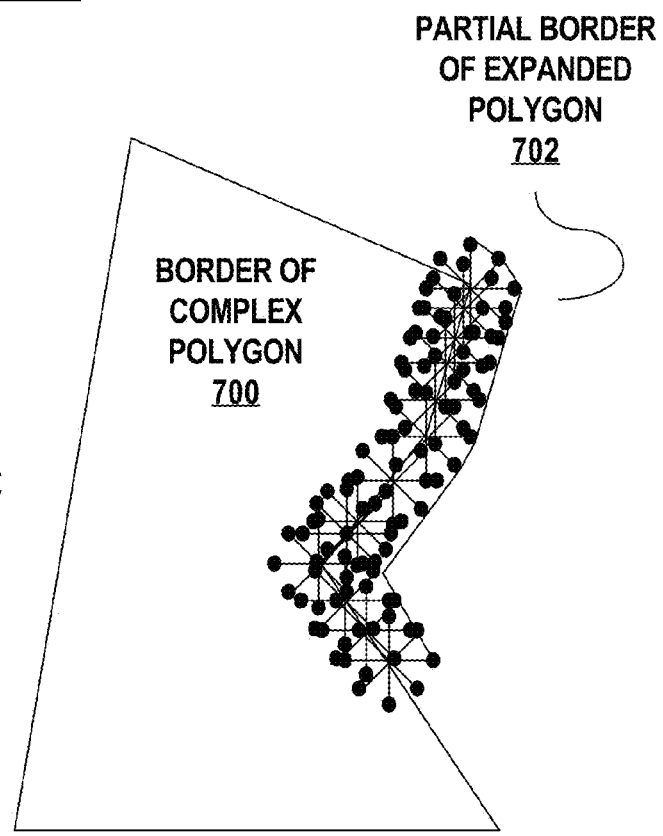
FIG. 7C illustrates a partial border of an example expanded polygon based on the example complex polygon and the example radially symmetric polygon.

One example illustration of applying Minkowski addition to expand an original polygon is provided in the sequence of FIG. 7A, FIG. 7B, and FIG. 7C.

FIG. 7A shows an example border of a complex polygon 700. The example six-sided polygon is labeled as "complex" for illustration purposes as a clear and succinct example of an expansion and simplification process. In practice, polygons may be extremely complex, including hundreds, thousands, or even a million or more sides. The expansion and simplification processes of various embodiments also may be applied to the more complex polygons, resulting in a magnitude of simplification of 10×, 100×, 1000×, or even more. In a particular example, the original polygon may be based on actual measurements of physical places or things, such as state, county, personal property, land, bodies of water, or other regional boundaries. Such measured polygons may be as complex or as high-resolution as the measurements allow.

FIG. 7B shows an example expansion polygon, in particular an example radially symmetric polygon 701. As shown, the radially symmetric polygon includes vertices that are evenly spaced around a perimeter of the polygon 701, and equidistant from the center of the polygon 701. Example expansion polygon 701 has 8 vertices and an origin at the center of the expansion polygon, but other expansion polygons may have different numbers of vertices. Copying radially symmetric polygon 701 to each of the vertices along the border of complex polygon 700 causes the border of complex polygon 700 to be expanded relatively equally in each direction with substantially rounded corners.

FIG. 7C shows an example partial border of an expanded polygon 702 that is determined by connecting the outer points of the copied expansion polygon 701. As shown, partial border 702 highly resembles original border 700, except that sharp corners have been rounded by the Minkowski addition of polygon 701 to the border of complex polygon 700.

Figure 6:
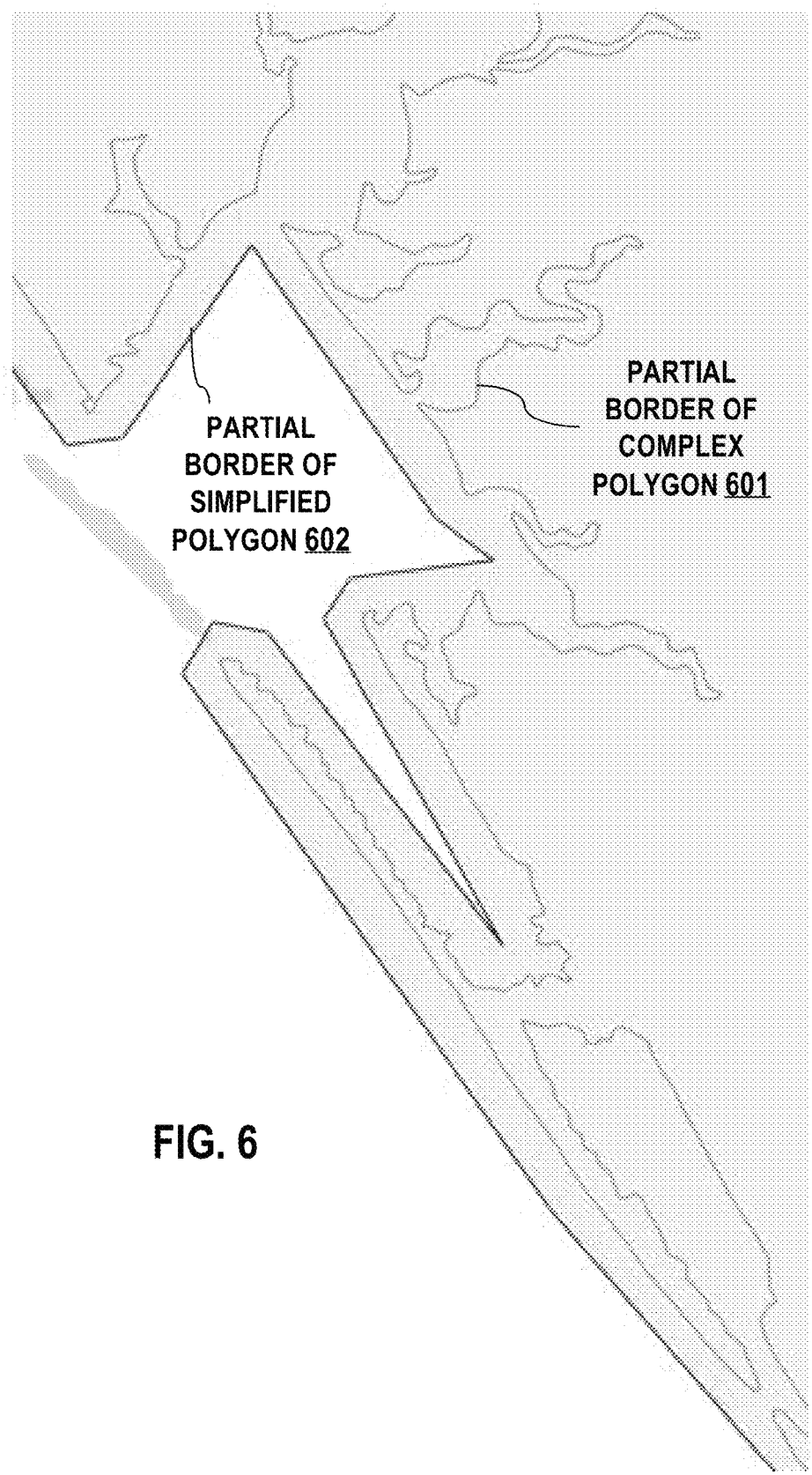
FIG. 6 illustrates a partial border of an example expanded simplified polygon based on an example complex polygon.

FIG. 6 shows an example partial border of a highly complex polygon 601, which may be expanded and reduced or simplified to the partial border of simplified polygon 602 in the same manner as described with reference to FIG. 7A, FIG. 7B, and FIG. 7C. In particular, partial border 602 may be created by using Minkowski addition on an expansion polygon and partial border of highly complex polygon 601.

In various other embodiments, polygon expansion may be accomplished using other processes, such as by linearly growing or scaling the polygon, on a vertex-by-vertex basis, a side-by-side basis, or with respect to the polygon as a whole; or by expanding only those vertices that connect two line segments that are not co-linear. Regardless of the expansion technique used, the expanded polygon may be described as a polygon that encompasses or includes the original polygon, and may also include additional area(s) or region(s) that were not covered by the original polygon. In other words, the expanded polygon includes the original polygon and has a greater area than the original polygon.

Vertex Reduction

In one embodiment, the vertex reducing logic determines, for an intermediate vertex of the set of expanded vertices, whether the intermediate vertex is within a threshold distance of a proposed segment between two other vertices of the set of expanded vertices, even if the intermediate vertex is not on the proposed segment. The vertex reducing logic removes the intermediate vertex from the set of expanded vertices in response to determining that the intermediate vertex is within the threshold distance of the proposed segment.

In one embodiment, if each expanded vertex in the set of expanded vertices is at least a particular distance outside of the original polygon, then any expanded vertex that is within the particular distance of a line between two other adjacent expanded vertices can be removed without reducing the border of the expanded polygon beyond the border of the original polygon. Also, multiple expanded vertices may be removed between two other non-adjacent expanded vertices if all of the multiple expanded vertices are within the particular distance of a line between the two other non-adjacent expanded vertices. Additionally, any expanded vertex that is on the line between two other adjacent vertices can be removed without expanding or reducing the border of the expanded polygon.

In one embodiment, a Raymer-Douglas-Peucker process is used to test each expanded vertex of the expanded polygon to determine whether the expanded vertex is an intermediate vertex that can be removed without reducing the expanded polygon beyond the boundary of the original polygon. In one example, a given vertex is considered an intermediate vertex that can be removed if a proposed line could be drawn between two other vertices such that the given vertex lies within a specified distance of the line. In one embodiment, the threshold distance is the buffer distance that was used by the polygon expanding logic to expand the original polygon. The two other vertices may be vertices that neighbor the given vertex. In various examples, multiple given vertices may be determined to be removable intermediate vertices if the multiple given vertices all lie within the specified distance of a line between two other vertices.

In one embodiment, the Raymer-Douglas-Peucker process selects a starting vertex on the expanded polygon and determines whether the starting vertex is a removable intermediate vertex between a first neighboring vertex and a second neighboring vertex. If the starting vertex is an intermediate vertex, the Raymer-Douglas-Peucker process determines whether the second neighboring vertex is a removable intermediate vertex between the first vertex and a third neighboring vertex. The set of removable intermediate vertices may continue to be expanded until a particular vertex is determined to be greater than the threshold distance away from a line between the first vertex and a next vertex. The process continues after the particular vertex to determine whether there are any removable intermediate vertices between the particular vertex and another vertex. The process may continue around the border of the expanded polygon until the process reaches the first vertex.

In various embodiment, the Raymer-Douglas-Peucker process may utilize different techniques for selecting starting vertices and next vertices to test for removable intermediacy. For example, the process may initially presume that all vertices between two given vertices are removable intermediate vertices unless any of those vertices is found to be greater than the threshold distance from a line between the two given vertices. The process may also skip vertices when attempting to locate non-removable vertices. For example, a proposed line may be drawn between every tenth or hundredth vertex to determine whether any of the vertices between the end vertices are greater than the threshold distance from the proposed line between the end vertices. The intermediate vertices that are greater than the threshold distance may be marked as non-removable vertices for a given iteration. Non-removable vertices may be expanded in later iterations into corresponding vertices that become removable.

In a particular example, a partial border of an original polygon is expanded into a partial border that includes three consecutive vertices, A, B, and C, each of which are at least a particular distance outside of the original polygon. If vertex B is within the particular distance of a line between vertices A and C, then vertex B may be removed from the expanded partial border, and, as a result, the expanded polygon described in part by the expanded partial border still encompasses the original polygon.

A resulting polygon may be generated by expanding the original polygon and reducing the number of vertices on the expanded polygon. The resulting polygon may be used, recursively, as an original polygon for another iteration of expansion and reduction, and each iteration of expansion and reduction may generate a further simplified resulting polygon. The original polygon may be roughly described, or estimated, using a resulting polygon from a first or later iteration of expansion and reduction, and the resulting polygon is known to encompass the original polygon even though the resulting polygon may have considerably fewer vertices than the original polygon.

Figure 8A:
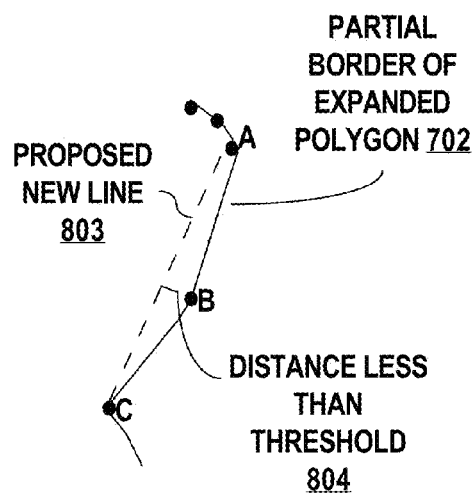
FIG. 8A illustrates a segment between A and B that is determined to be within a threshold distance of several other points of the example expanded polygon of FIG. 7.
Figure 8B:
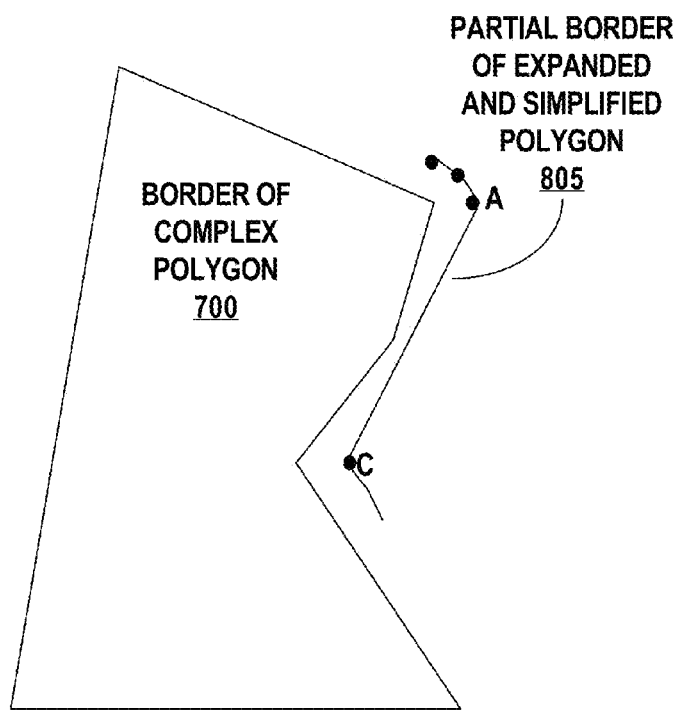
FIG. 8B illustrates a partial border of an expanded simplified polygon based on the example complex polygon and the example radially symmetric polygon of FIG. 7A and FIG. 7B, respectively.

FIG. 8A and FIG. 8B illustrate an example of reducing a number of vertices for an expanded polygon. As shown, partial border of expanded polygon 702 includes vertices A, B, and C. The process includes determining a proposed line 803 between vertex A and vertex C on partial border of expanded polygon 702.

The process further includes determining whether vertex B, which lies between vertex A and vertex C on partial border 702, is within a threshold distance 804 of proposed line 803. If vertex B is within the threshold distance, as shown, then vertex B may be removed to generate a partial border of an expanded and simplified polygon 805, as shown in FIG. 8B. The process may continue around the border of complex polygon 700 to simplify the polygon such that the polygon has fewer vertices and fewer sides. A resulting expanded and simplified polygon may be a good estimate of the original polygon and may also be easier to store and process than the original polygon.

Polygon Reduction and Vertex Reduction

As described under the headings Polygon Expansion and Vertex Reduction, a polygon may be expanded, and the number of vertices in the polygon may be reduced to generate a simplified expanded polygon that encompasses an original polygon. Similarly, a polygon may be reduced, and the number of vertices in the polygon may be reduced to generate a simplified reduced polygon that is encompassed by the original polygon.

In one embodiment, the polygon reducing logic receives information that represents an original polygon having a set of original vertices. The polygon reducing logic determines a reduced polygon having a set of reduced vertices, such that the reduced polygon is encompassed within the original polygon, by determining, for each original vertex of the set of original vertices, a set of reduced vertices that are derived from the original vertex and are at least a particular distance inside the original polygon. The set of reduced vertices may be determined by creating new vertices around each of the original vertices in the original polygon. New vertices that are outside the original polygon and optionally new vertices that are within a particular distance of the border of the original polygon may be excluded or removed from the set of reduced vertices, leaving only those new vertices that are inside the original polygon, optionally at least the particular distance inside the original polygon.

In one embodiment, a new set of vertices is created around a given vertex of the original polygon by creating new vertices at a specified distance away from the given vertex. The specified distance may be, for example, greater than the particular distance that is used for determining which new vertices are excluded or removed from the set of reduced vertices. For example, new vertices may be created at a distance, r, from the given vertex. In a particular example, a new vertex may be included in the set of reduced vertices only if the new vertex is inside the original polygon and greater than or equal to a distance, d, from the border of the original polygon. Alternately, a new vertex may initially be included in the set but may be removed if the new vertex is not inside the original polygon and greater than or equal to a distance, d, from the border of the original polygon.

In a particular example, suppose that a given vertex, $v_0$, lies in the middle of a flat portion of the surface of the original polygon, connecting two line segment portions of the original polygon at an angle of 180 degrees. If three new vertices, $v_1$, $v_2$, and $v_3$, are created at angles $\Theta_1=45$ degrees, $\Theta_2=90$ degrees, and $\Theta_3=135$ degrees with respect to the surface of the original polygon, at a distance, r, from the given vertex, then the distances of the new vertices from the surface of the original polygon will be r*sin ($\Theta$), or $d_1 \approx r*0.71$, $d_2 \approx r$, and $d_3 \approx r*0.71$. New vertices may be excluded from the set of reduced vertices if they are not at least a threshold distance inside of the surface of the original polygon. For example, the threshold distance may be greater than or equal to r*0.71 (i.e., r*(sq. rt. 2)/2)), in which case vertices $v_1$ and $v_3$ would be excluded from the set of reduced vertices, leaving only $v_2$, at a distance r from $v_0$, and at an angle of 90 degrees from the surface of the original polygon. In another example, if the threshold distance is less than r*0.71, then vertices $v_1$, $v_2$, and $v_3$ would all be kept as part of the set of reduced vertices for a reduced polygon.

In one embodiment, the new set of vertices is created using new vertices at the same specified angles for all original vertices in the original polygon. In a particular embodiment, the new set of vertices is created using Minkowski subtraction on the original polygon and a reduction polygon. The reduction polygon includes a set of reduction vertices and an origin. Using Minkowski subtraction, the original polygon may be reduced by copying the reduction polygon to the original vertices of the original polygon such that the origin or center of each copy of the reduction polygon is located at the original vertex. A set of reduction points may be determined by selecting those points of the various copies of the reduction polygons that are inside of the original polygon, or, optionally, at least a threshold distance inside of the original polygon. The set of reduction points may also be determined as the innermost points from the reduction polygons.

In various other embodiments, polygon reduction may be accomplished using other processes, such as by linearly shrinking or scaling the polygon, on a vertex-by-vertex basis, a side-by-side basis, or with respect to the polygon as a whole; or by reducing only those vertices that connect two line segments that are not co-linear. Regardless of the reduction technique used, the reduced polygon may be described as a polygon that is encompassed by or included within the original polygon, and the original polygon may also include additional area(s) or region(s) that are not covered by the reduced polygon. In other words, the reduced polygon is included within the original polygon and has a smaller area than the original polygon.

Polygon reduction may be followed by vertex reduction in the same manner that polygon expansion may be followed by vertex reduction. The vertex reduction logic receives an expanded or reduced polygon object and eliminates removable intermediate vertices to generate an expanded or reduced simplified polygon object. After vertex reduction, the expanded or reduced simplified polygon object may have significantly fewer vertices than the original polygon object.

Vertex Reduction Before or During Polygon Expansion or Reduction

In one embodiment, vertex reduction is performed prior to polygon expansion or reduction. The original polygon, or a resulting polygon from a prior iteration of vertex reduction and polygon expansion, may be used as the input to the vertex reducing logic. The vertex reducing determines, for an intermediate vertex of a set of input vertices, whether the intermediate vertex is within a threshold distance of a proposed segment between two other vertices of the set of input vertices, even if the intermediate vertex is not on the proposed segment. The vertex reducing logic removes the intermediate vertex from the set of input vertices in response to determining that the intermediate vertex is within the threshold distance of the proposed segment. During each iteration of vertex reduction and polygon expansion or reduction, vertex reduction may be performed before, after, or even in parallel with polygon expansion or reduction. If performed in parallel, a set of removable intermediate vertices may be identified from the original polygon as inputted into the vertex reduction logic. Once identified, vertices in the expanded or reduced polygon that correspond to the removable intermediate vertices may be removed.

Polygon Simplification on a Three-Dimensional Surface

In one embodiment, polygon simplification is performed on a polygon that is defined on a three-dimensional surface. For example, polygon expanding or reducing logic may receive information that represents a first polygon having a first set of vertices that may or may not be co-planar. The polygon expanding or reducing logic may also receive information about a three-dimensional surface on which the polygon lies. Alternately, the polygon expanding or reducing logic may be specially configured to handle polygons that lie on particular surfaces. For example, the polygon expanding or reducing logic may expect to receive coordinates for polygons that lie on the surface of a globe. In a particular example, the coordinates define boundaries for regions on the globe.

The polygon expanding or reducing logic determines a second polygon having a second set of vertices, such that the second polygon encompasses or is encompassed by the first polygon on the three-dimensional surface. For example, the polygon expanding or reducing logic may determine, for each vertex of the first set of vertices, a new set of vertices that are derived from the vertex and are at least a particular distance inside or outside the first polygon on the three-dimensional surface. The vertex reducing logic determines, for an intermediate vertex of the second set of vertices, whether the intermediate vertex is within the particular distance of a proposed segment along the three-dimensional surface between two other vertices of the second set of vertices, even though the intermediate vertex is not on the proposed segment. For example, the proposed segment may be a proposed arc segment for a polygon that spans along the surface of a globe. The vertex reducing logic removes the intermediate vertex from the second set of vertices in response to determining that the intermediate vertex is within the particular distance of the proposed segment along the three-dimensional surface.

In another embodiment, the input polygon may be formed by taking a projection of a three-dimensional surface onto a plane. Simplification and expansion or reduction may be performed on the projected polygon to generate a resulting simplified polygon in the plane. In one embodiment, the resulting simplified polygon in the plane is mapped back onto the three-dimensional surface.

In yet another embodiment, the input polygon for expansion or reduction may be a face of a polyhedron. The faces of the polyhedron may be expanded, simplified, and joined together to produce an expanded and simplified polyhedron that encompasses the original polyhedron, or reduced, simplified, and joined together to produce a reduced polyhedron that is encompassed by the original polyhedron.

Storing the Expanded or Reduced Simplified Polygon

Once the original polygon has been simplified into an expanded or reduced simplified polygon, the simplified polygon may be returned to a running process and/or may be stored on a computer-readable medium. The simplified polygon may be stored alternatively or in addition to the original polygon. In one embodiment, a simplified polygon is stored in association with each of a plurality of complex polygons, optionally before any requests have been made with respect to the complex polygons. For example, each of a plurality of regions on a globe may be associated with a simplified polygon. In another embodiment, the simplified polygon may be computed on the fly in response to requests that are made with respect to a corresponding complex polygon.

Whenever a computation is performed with respect to any of the complex regions, the simplified form of the region may be utilized for the computation. Also, the simplified region may be utilized to visualize or display lower resolution or lower quality representations of the region. For example, a simplified version of the region may be utilized when representing the region while zoomed out on a globe or larger area, and a complex version of the region may be utilized when representing the region while zoomed into the region, or when the region consumes over a threshold amount of viewable space. Storing and using simplified versions of the regions may result in faster processing of visualizations, faster computations with respect to items inside or outside of the regions, and utilization of fewer computational resources, such as memory and/or processor cycles, to perform visualization operations or search operations on the regions.

In one embodiment, a complex polygon object is discarded after computation of a corresponding simplified polygon object. The simplified polygon object may require less space to store on disk and may be sufficient in a particular implementation. In one embodiment, a complex polygon or simplified polygon may be divided up into different regions or slices, and the different regions or slices may be stored separately on disk. In one example, separate groups of regions or slices may be stored on separate groups of disks and/or maintained on separate groups of machines. In a particular example, a client may issue a request that corresponds to a particular group of regions. The request may be forwarded to a corresponding group of disks or machines that stores information for the particular group of regions. The information is retrieved and processed by the corresponding group of disks or machines before a result is provided to the client.

In one embodiment, a simplified or complex polygon with an even number of vertices, n, may be partitioned into (n/2)+1 regions by drawing a line between every other vertex. A simplified or complex polygon with an odd number of vertices, n, may be partitioned by adding a midpoint to the longest segment and drawing a line between every other vertex, resulting in (n+1)/2 regions. Polygons may also be partitioned into slices by drawing a line between the vertices and a center of the polygon. In one embodiment, a complex polygon is partitioned based on the regions identified from a simplified polygon that corresponds to the complex polygon. In one embodiment, different groups of computing devices are used to process requests for different groups of partitioned regions.

Searching the Expanded or Reduced Simplified Polygon

In one embodiment, a request is received to search for data items that are inside or outside an original polygon. For example, the data items may represent people, buildings, organizations, vehicles, or mobile devices, and the request may be for data items with particular characteristics that are currently within a particular governmental region, have recently been within the particular governmental region, have been within the particular governmental region within a particular period of time, or have ever been within the particular governmental region. An expanded simplified polygon may be used to determine a set of preliminary results that includes the data items that satisfy the request. The expanded simplified polygon may be generated in response to the request, may be cached from a previous request, or may be stored in association with the region whether or not requests have been received. The expanded simplified polygon is bigger than the original polygon and may also include additional results that do not satisfy the request. In one embodiment, request processing logic removes, from the preliminary results, items that, although they were in the expanded simplified polygon, are not within the original polygon. In one embodiment, the items to be removed from the set of preliminary results are flagged for removal. In one example, the set of preliminary results is returned in response to the request, and the set of preliminary results is corrected by an update that removes the items that were inside the expanded simplified polygon but not inside the original polygon. In another example, the results are not returned until after correction.

In another example, the request may be for data items with particular characteristics that are currently outside a particular governmental region, have recently been outside the particular governmental region, have been outside the particular governmental region within a particular period of time, or have ever been outside the particular governmental region. A reduced simplified polygon may be used to determine a set of preliminary results that includes the data items that satisfy the request. The reduced simplified polygon may be generated in response to the request, may be cached from a previous request, or may be stored in association with the region whether or not requests have been received. The reduced simplified polygon is smaller than the original polygon, and searching for items outside of the reduced simplified polygon may provide additional results that do not satisfy the request. In one embodiment, request processing logic removes, from the preliminary results, items that, although they were outside of the reduced simplified polygon, are not outside the original polygon. In one embodiment, the items to be removed from the set of preliminary results are flagged for removal. In one example, the set of preliminary results is returned in response to the request, and corrected by an update that removes the items that were outside the reduced simplified polygon but not outside the original polygon. In another example, the results are not returned until after correction.

In one embodiment, a search pertains to results that are on or within a specified distance of a boundary of an original polygon. In one example, the search may be evaluated by determining all items that are between the simplified reduced polygon and the simplified expanded polygon. If the simplified polygons are generated on the fly, the simplified polygons may be generated in sequence or in parallel before searching for data items that are between the simplified polygons. If the search is for items that are on or within a specified distance of the boundary of the original polygon, a set of preliminary results between the simplified polygons may be updated to remove items that are not on or within the specified distance of the boundary of the original polygon. In one example, the simplified polygons are created to be expanded or reduced by at least a minimum buffer distance, and the space between the expanded and reduced polygons encloses an area that includes all points that are less than the minimum buffer distance from the boundary.

In one embodiment, regions with holes may be defined by multiple polygons, each of which may be simplified. For example, a region with a hole may be defined as a region between an outer polygon and an inner polygon. A search for items within a region that has a hole may be performed by searching for all of the items within the space between an expanded simplified version of the outer polygon and a reduced simplified version of the inner polygon. The results may be updated to remove items that are not within the original region. If a polygon is divided into pieces or slices, in one embodiment, search operations are processed with respect to each slice or piece separately and then combined to form a result set.

Updating the Simplified Polygons

If a simplified polygon is stored persistently for use in multiple computations, the simplified polygon may become stale as a result of a change to the original polygon. In one embodiment, simplified versions of an original polygon may be periodically re-calculated to accommodate for changes to the original polygon. In another embodiment, simplified version of an original polygon may be re-calculated in response to any change in the original polygon, or in response to any change that crosses or could cross the boundary of the simplified polygon. In yet another embodiment, simplified polygons are discarded when the simplified polygons become stale due to a change. The simplified polygons may be re-computed on an as-needed basis if further processing is required on the corresponding original polygons.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 5:
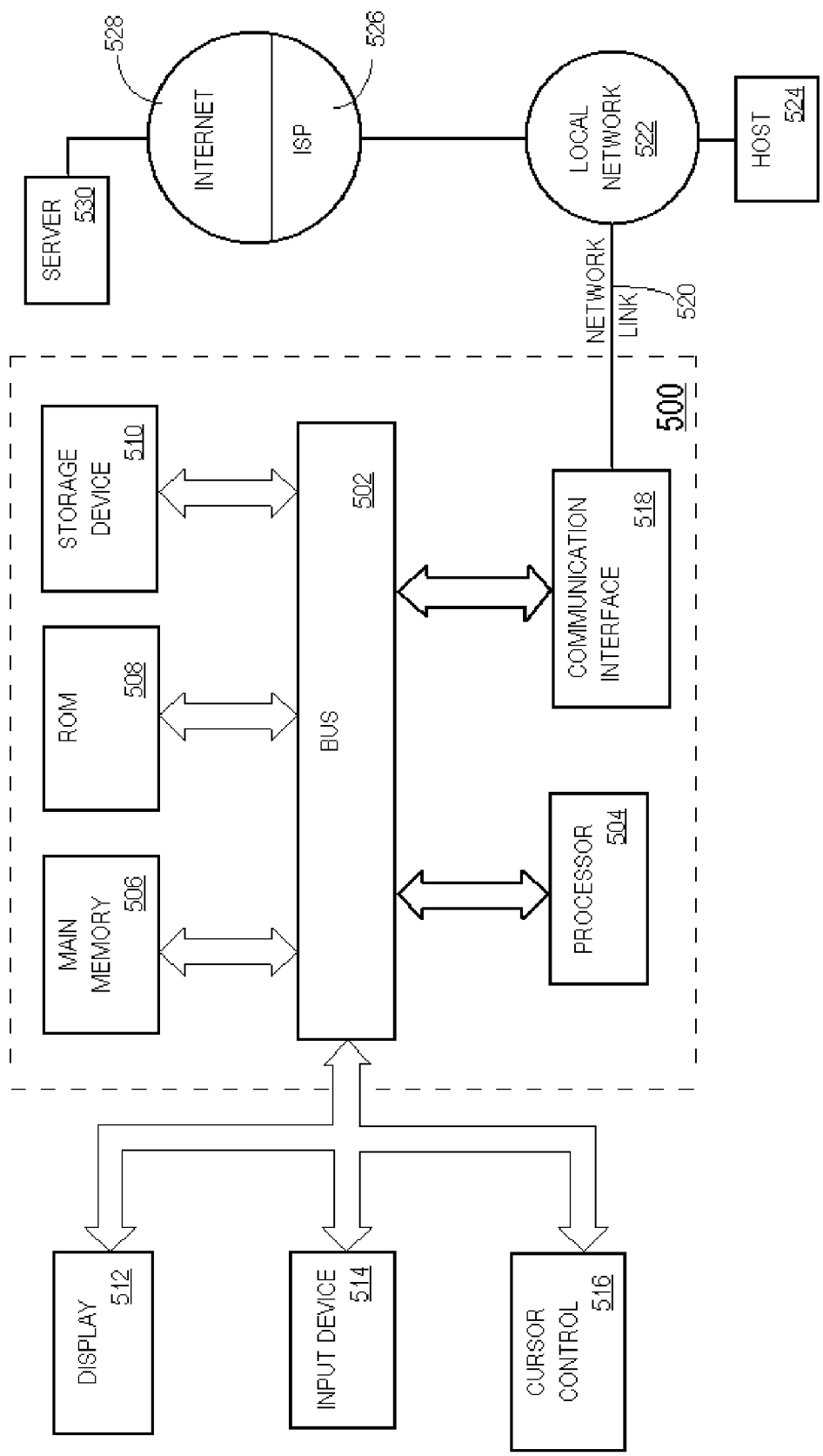
FIG. 5 illustrates an example computer system for performing embodiments of the buffer simplification processes described herein.

For example, FIG. 5 is a block diagram that illustrates a computer system 500 upon which an embodiment of the invention may be implemented. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A process comprising:
 receiving, by one or more computing devices, first data representing a first polygon having a first set of vertices;
 generating a resulting polygon at least in part by:
  using polygon expanding logic of the one or more computing devices, causing determining a second polygon having a second set of vertices, such that the second polygon encompasses the first polygon, by determining, for each particular vertex in the first set of vertices, one or more new vertices that are determined from that particular vertex and are at least a particular distance outside the first polygon;

using vertex reducing logic of the one or more computing devices, causing determining, for an intermediate vertex of the second set of vertices, whether the intermediate vertex is within the particular distance of a proposed segment between two other vertices of the second set of vertices, wherein the intermediate vertex is not on the proposed segment;

using the vertex reducing logic, causing removing the intermediate vertex from the second set of vertices in response to determining that the intermediate vertex is within the particular distance of the proposed segment;

on one or more non-transitory computer-readable storage media, storing the resulting polygon in association with the first polygon, wherein the resulting polygon has fewer vertices than the first polygon.

2. The process of claim 1, wherein the one or more new vertices are a fixed distance away from the particular vertex, wherein the fixed distance is greater than the particular distance.

3. The process of claim 1, wherein the one or more new vertices include all those vertices, from a fixed number of possible vertices at fixed angles away from the particular vertex, that are outside the first polygon by at least the particular distance.

4. The process of claim 1, further comprising:
using the vertex reducing logic, causing determining, for a plurality of intermediate vertices of the second set of vertices, whether the intermediate vertices are within the particular distance of segments between other vertices of the second set of vertices;
using the vertex reducing logic, causing removing a subset of the plurality of intermediate vertices in response to determining that intermediate vertices from the subset of the plurality of intermediate vertices are within the particular distance of segments between other vertices of the second set of vertices.

5. The process of claim 1, wherein the proposed segment is a first proposed segment, further comprising recursively performing: determining a third polygon having a third set of vertices, wherein the third set of vertices encompass a prior second polygon having a prior second set of vertices, determining whether an intermediate vertex of the third set of vertices is within the particular distance of a second proposed segment between two other vertices of the third set of vertices, and removing the intermediate vertex from the third set of vertices in response to determining that the intermediate vertex is within the particular distance of the second proposed segment between the two other vertices of the third set of vertices.

6. The process of claim 5, comprising repeating the steps of determining the third polygon, determining whether the intermediate vertex is within the particular distance, and removing the intermediate vertex until the resulting polygon has fewer than a specified number of vertices.

7. The process of claim 6, further comprising:
receiving the specified number as user input;
causing display of the first polygon before receiving the specified number;
causing display of the resulting polygon in response to receiving the specified number as user input.

8. The process of claim 5, comprising repeating the steps of determining the third polygon, determining whether the intermediate vertex is within the particular distance, and removing the intermediate vertex to form the resulting polygon, further comprising:

causing receiving a command to be evaluated against the first polygon;
in response to receiving the command, causing evaluation of the command against the resulting polygon.

9. The process of claim 8, wherein the command is a search for data items within the first polygon, wherein causing evaluation of the command against the resulting polygon generates a resulting set of data items, the process further comprising causing determining that one or more data items in the resulting set of data items are outside of the first polygon and, in response, removing the one or more data items from the resulting set of data items.

10. The process of claim 1, wherein the polygon expanding logic comprises logic for performing a Minkowski addition expanding process on the particular vertex and a radially symmetric polygon; wherein the vertex reducing logic comprises logic for performing a Ramer-Douglas-Peucker vertex reducing process on the intermediate vertex and the two other vertices.

11. The process of claim 1, wherein the first polygon is on a three-dimensional surface, and wherein the particular distance is a distance along the three-dimensional surface.

12. The process of claim 1, wherein the first polygon is on a plane, and wherein the segment is a line segment.

13. The process of claim 12, further comprising causing determining the first polygon from another polygon on a three-dimensional surface by determining a projection from the three-dimensional surface onto the plane.

14. The process of claim 1, wherein the first polygon is a face of a first polyhedron, and wherein the second polygon is a corresponding face of a second polyhedron.

15. The process of claim 1, wherein the first polygon has a third set of vertices in addition to the first set of vertices, and wherein determining the second polygon is performed without determining, for any vertex in the third set of vertices, a new set of vertices that are at least a particular distance outside the first polygon.

16. One or more non-transitory computer-readable storage media storing instructions which, when executed by one or more processors, cause the one or more processors to perform:
receiving, by one or more computing devices, first data representing a first polygon having a first set of vertices;
generating a resulting polygon at least in part by:
using polygon expanding logic of the one or more computing devices, causing determining a second polygon having a second set of vertices, such that the second polygon encompasses the first polygon, by determining, for each particular vertex in the first set of vertices, one or more new vertices that are determined from that particular vertex and are at least a particular distance outside the first polygon;
using vertex reducing logic of the one or more computing devices, causing determining, for an intermediate vertex of the second set of vertices, whether the intermediate vertex is within the particular distance of a proposed segment between two other vertices of the second set of vertices, wherein the intermediate vertex is not on the proposed segment;
using the vertex reducing logic, causing removing the intermediate vertex from the second set of vertices in response to determining that the intermediate vertex is within the particular distance of the proposed segment;
on one or more non-transitory computer-readable storage media, storing the resulting polygon in association with the first polygon, wherein the resulting polygon has fewer vertices than the first polygon.

17. The media of claim 16, wherein the one or more new vertices are a fixed distance away from the particular vertex, wherein the fixed distance is greater than the particular distance.

18. The media of claim 16, wherein the one or more new vertices include all those vertices, from a fixed number of possible vertices at fixed angles away from the particular vertex, that are outside the first polygon by at least the particular distance.

19. The media of claim 16, further comprising instructions which when executed cause:
using the vertex reducing logic, causing determining, for a plurality of intermediate vertices of the second set of vertices, whether the intermediate vertices are within the particular distance of segments between other vertices of the second set of vertices;
using the vertex reducing logic, causing removing a subset of the plurality of intermediate vertices in response to determining that intermediate vertices from the subset of the plurality of intermediate vertices are within the particular distance of segments between other vertices of the second set of vertices.

20. The media of claim 16, wherein the proposed segment is a first proposed segment, further comprising instructions which when executed cause recursively performing: determining a third polygon having a third set of vertices, wherein the third set of vertices encompass a prior second polygon having a prior second set of vertices, determining whether an intermediate vertex of the third set of vertices is within the particular distance of a second proposed segment between two other vertices of the third set of vertices, and removing the intermediate vertex from the third set of vertices in response to determining that the intermediate vertex is within the particular distance of the second proposed segment between the two other vertices of the third set of vertices.

21. The media of claim 20, further comprising instructions which when executed cause repeating the determining the third polygon, determining whether the intermediate vertex is within the particular distance, and removing the intermediate vertex until the resulting polygon has fewer than a specified number of vertices.

22. The media of claim 19, further comprising instructions which when executed cause:
receiving the specified number as user input;
causing display of the first polygon before receiving the specified number;
causing display of the resulting polygon in response to receiving the specified number as user input.

23. The media of claim 20, further comprising instructions which when executed cause repeating the determining the third polygon, determining whether the intermediate vertex is within the particular distance, and removing the intermediate vertex to form the resulting polygon; further comprising instructions which when executed cause receiving a command to be evaluated against the first polygon; in response to receiving the command, causing evaluation of the command against the resulting polygon.

24. The media of claim 20, wherein the command is a search for data items within the first polygon, wherein causing evaluation of the command against the resulting polygon generates a resulting set of data items, the media further comprising instructions which when executed cause determining that one or more data items in the resulting set of data items are outside of the first polygon and, in response, removing the one or more data items from the resulting set of data items.

25. The media of claim 20, wherein the polygon expanding logic comprises logic for performing a Minkowski addition expanding process on the particular vertex and a radially symmetric polygon; wherein the vertex reducing logic comprises logic for performing a Ramer-Douglas-Peucker vertex reducing process on the intermediate vertex and the two other vertices.

26. The media of claim 20, wherein the first polygon is on a three-dimensional surface, and wherein the particular distance is a distance along the three-dimensional surface.

27. The media of claim 20, wherein the first polygon is on a plane, and wherein the segment is a line segment.

28. The media of claim 27, further comprising instructions which when executed cause determining the first polygon from another polygon on a three-dimensional surface by determining a projection from the three-dimensional surface onto the plane.

29. The media of claim 20, wherein the first polygon is a face of a first polyhedron, and wherein the second polygon is a corresponding face of a second polyhedron.

30. The media of claim 20, wherein the first polygon has a third set of vertices in addition to the first set of vertices, and wherein determining the second polygon is performed without determining, for any vertex in the third set of vertices, a new set of vertices that are at least a particular distance outside the first polygon.

* * * * *